United States Patent
Yang et al.

[11] Patent Number: 6,135,168
[45] Date of Patent: Oct. 24, 2000

[54] STANDARD MECHANICAL INTERFACE WAFER POD GAS FILLING SYSTEM

[75] Inventors: Tung-Fang Yang, Sanhsing Shiang Ilang Hsien; Tzong-Ming Wu, Taipei, both of Taiwan

[73] Assignee: Industrial Technology Research Institute, Hsinchu, Taiwan

[21] Appl. No.: 09/469,639

[22] Filed: Dec. 22, 1999

[51] Int. Cl.⁷ ...................................................... B65B 1/04
[52] U.S. Cl. ................................ 141/98; 141/91; 141/93; 141/95; 414/217; 414/331.01; 414/331.04; 414/939; 414/937; 414/940
[58] Field of Search .................................... 206/710, 711, 206/712; 414/217, 292, 937, 939, 940, 331.01, 331.04; 141/63–67, 69, 70, 85, 87–89, 93, 91, 95, 98

[56] References Cited

U.S. PATENT DOCUMENTS

5,586,585  12/1996  Bonora et al. ............................. 141/93
5,806,574  9/1998  Yamashita et al. ........................ 141/63

Primary Examiner—Steven O. Douglas
Assistant Examiner—Timothy L. Maust
Attorney, Agent, or Firm—Pro-Techtor International Services

[57] ABSTRACT

A standard mechanical interface wafer pod gas filling system, comprising: a platform, carrying a wafer pod cover of a wafer pod; a pod hold-down latch mechanism; a port, carrying a wafer pod base, with lateral gaps between the platform and the port; a pod door lock/unlock mechanism, mounted on the lower side of the platform; a port door up/down mechanism; several nozzles, mounted on one lateral side of the platform, having widening ends, wherein the lateral gap located opposite to the nozzles is wider than the other lateral gaps; a charging box, mounted on the lower side of the platform; and a gas supply unit for supplying inert gas through the nozzles and taking out air from the wafer pod.

7 Claims, 11 Drawing Sheets

STANDARD MECHANICAL INTERFACE WAFER POD GAS FILLING SYSTEM

BACKGROUND OF THE INVENTION

1. Field of the Invention

The present invention relates to a wafer pod gas filling system, particularly to a wafer pod gas filling system having a standard mechanical interface (SMIF).

2. Description of Related Art

Conventionally, during production of semiconductor wafers, if in a pod for transport or temporary storage oxygen and moisture are contained, the wafer surface easily and often undergoes undesired reactions, e.g., a native oxide film develops. Since today's semiconductor wafers have an increasingly refined structure with a high degree of integration, the wafer surfaces become more and more sensitive to the environment thereof. Particularly for critical fabrication steps, like thermal processing, chemical vapor deposition, or sputtering, these undesired reactions reduce product quality and often cause electrical device failure.

Therefore, for transport or temporary storage of wafers in a pod, a gas filling system is needed, substituting an inert gas, like nitrogen or helium for air, so as to maintain required production quality.

Conventional gas filling systems, however, have several disadvantages:

1. A conventional wafer pod gas filling system is not adaptable to a mechanical interface, thus standard wafer pods cannot be connected. A latch mechanism cannot be locked to the wafer pod cover, so that the wafer pod easily shakes when filled with gas.

2. The gas filling nozzle and the gas outlet are located on the same side, therefore during filling gas escapes laterally, resulting in waste of gas, inefficient filling and high gas consumption of over 70 liters per minute. Then pressure exceeds 125 psi, there is also an operational risk.

3. A conventional wafer pod gas filling system has no built-in inert gas supply unit, only an inlet and an outlet. Therefore, filling is slow, and there is no way to adjust pressure and flow.

4. A conventional wafer pod gas filling system has a single nozzle which is horizontally oriented. Thus gas flows out rapidly with a large noise, causing vibrations of the wafer in the pod.

Conventional wafer pod gas filling systems therefore have several shortcomings.

SUMMARY OF THE INVENTION

The main object of the present invention is to provide a standard mechanical interface wafer pod gas filling system which fits tightly on any type of SMIF wafer pods.

Another object of the present invention is to provide a standard mechanical interface wafer pod gas filling system which allows effective filling without waste of gas.

A further object of the present invention is to provide a standard mechanical interface wafer pod gas filling system with reduced pressure and noise during operation.

The present invention can be more fully understood by reference to the following description and accompanying drawings.

DETAILED DESCRIPTION OF THE PREFERRED EMBODIMENTS

The standard mechanical interface wafer pod gas filling system of the present invention mainly comprises: a main frame 100; a port assembly 200; a charging box 300; latch mechanisms 400a, 400b; a pod door lock/unlock mechanism 500; a port door up/down mechanism 600; and a gas supply unit 700.

Figure 3:
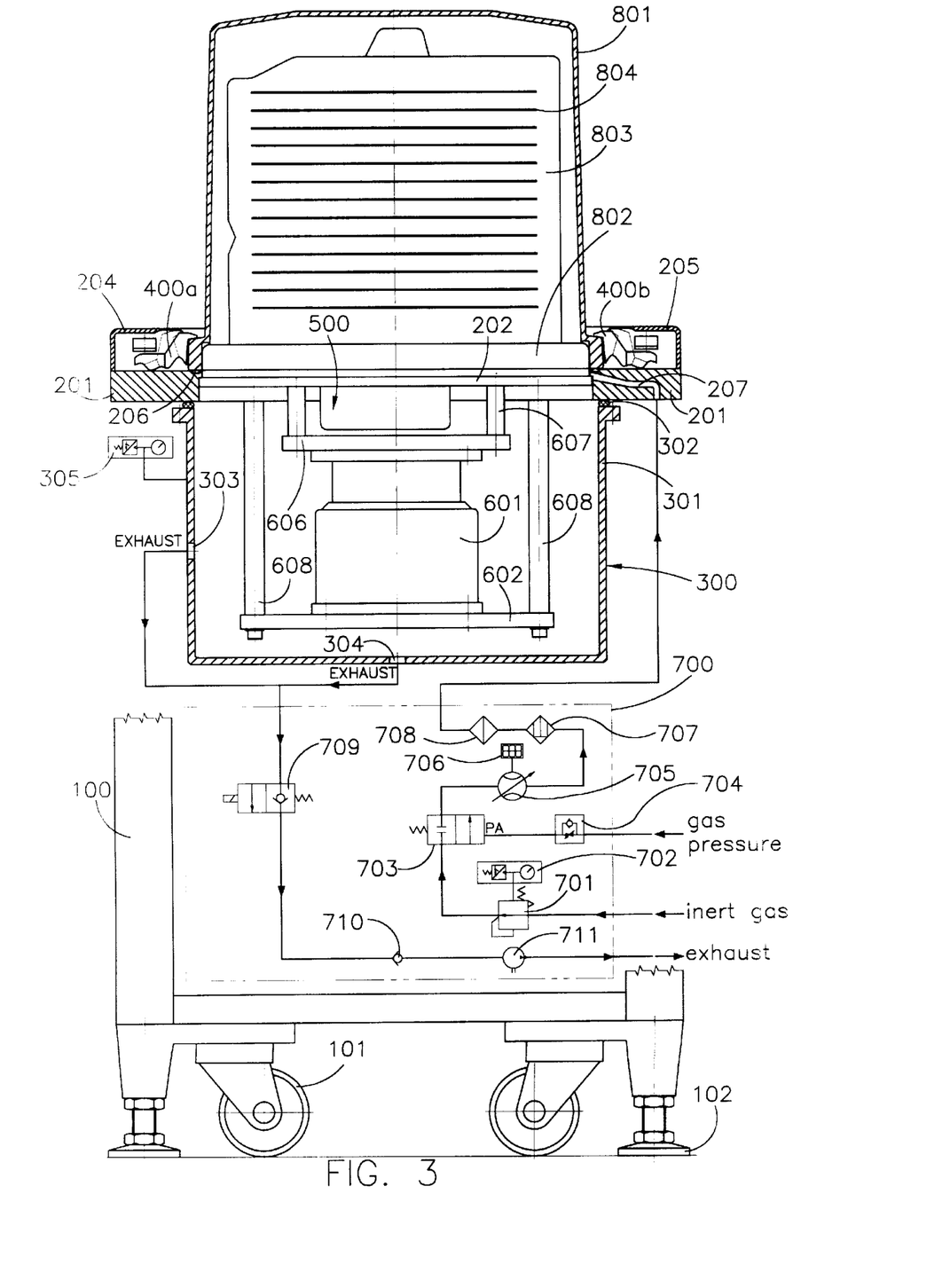
FIG. 3 is a schematic illustration from the left of the gas filling system of the present invention in the sealed state.
Figure 4:
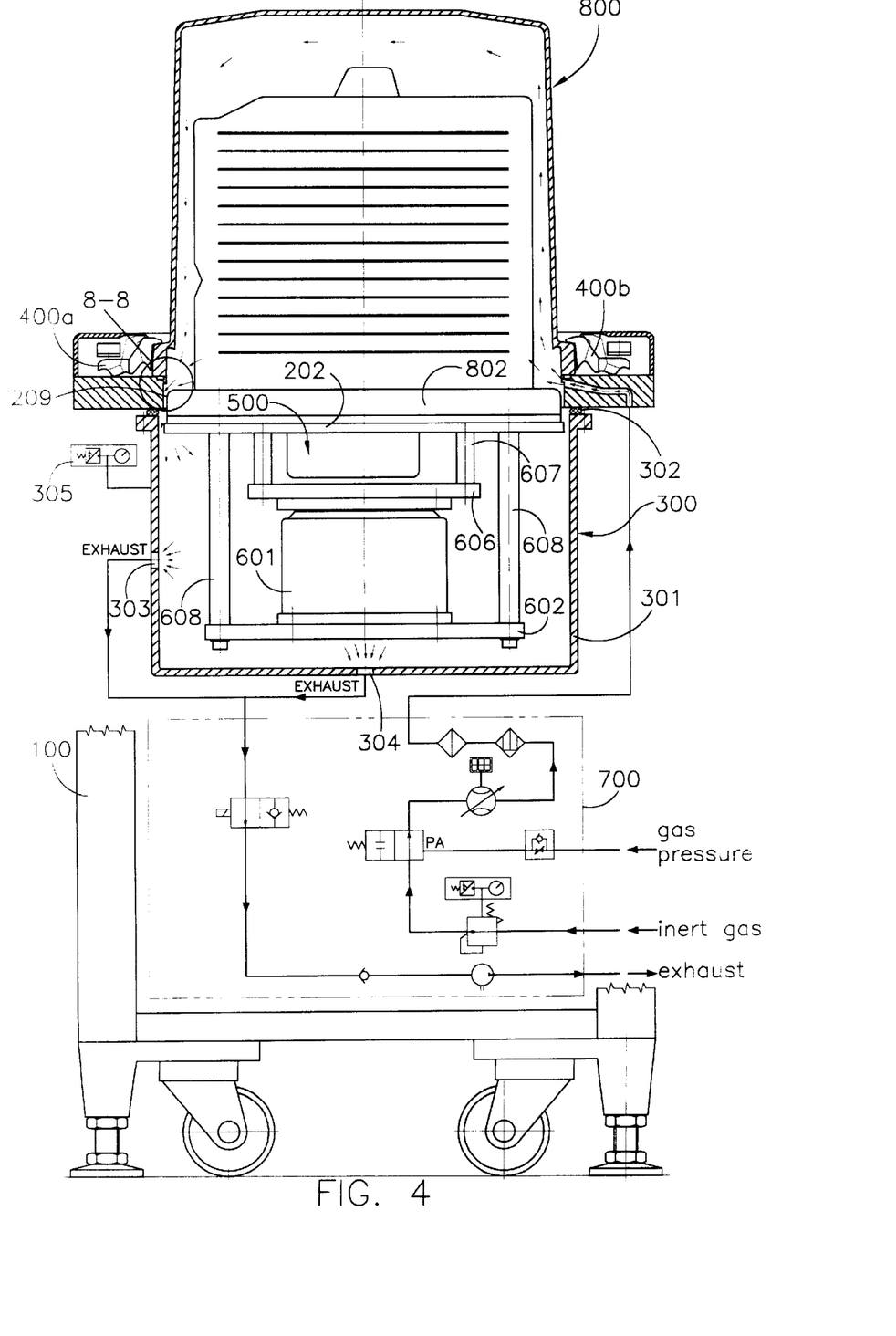
FIG. 4 is a side view from the left of the gas filling system of the present invention in the filling state, with the port door up/down mechanism having sunk to a certain vertical position.

As shown in FIGS. 3 and 4, the main frame 100 provides support, holding and fixing all structural parts. Rolls 101 and legs 102 allow to move the present invention between various clean rooms and to set up the present invention where needed.

Referring to FIGS. 1–4, the port assembly 200 has a standard mechanical interface, allowing to be connected to a SMIF wafer pod 800 of any type. The wafer pod 800 has a pod cover 801, having a lower end with a perimeter and a peripheral shoulder, and a wafer pod base 802, carrying a cassette 803 which contains wafers 804. The wafer pod base 802 has locked and unlocked states. The port assembly 200 comprises a platform 201, defining a front side, a rear side, a left side, a right side, an upper side a lower side; and a port 202. On the front end of the platform 201 two front guide rails 204 are mounted, and on the rear end of the platform 201 two rear guide rails 205 are mounted. Nozzles 207a, 207b are set on the two rear guide rails 205. The platform 201 supports the pod cover 801. A gasket 206 is laid on the upper side of the platform 201 to seal the pod cover 801 on the perimeter thereof against the platform 201. An opening 201a is cut into the platform 201 in a central position to provide a passageway for raising and lowering the wafer pod base 802 with the cassette 803. The front and rear guide rails 204, 205 help to set and to position the wafer pod 800 roughly on the platform 201. The port 202 is located in the opening 201a, with four gaps 209 between the platform 201 and the port 202. Three registration pins 203a, 203b, 203c are set on the port 202, engaging with the wafer pod base 802, so as to determine an orientation of the wafer pod base 802 with the cassette 803.

Figure 2:
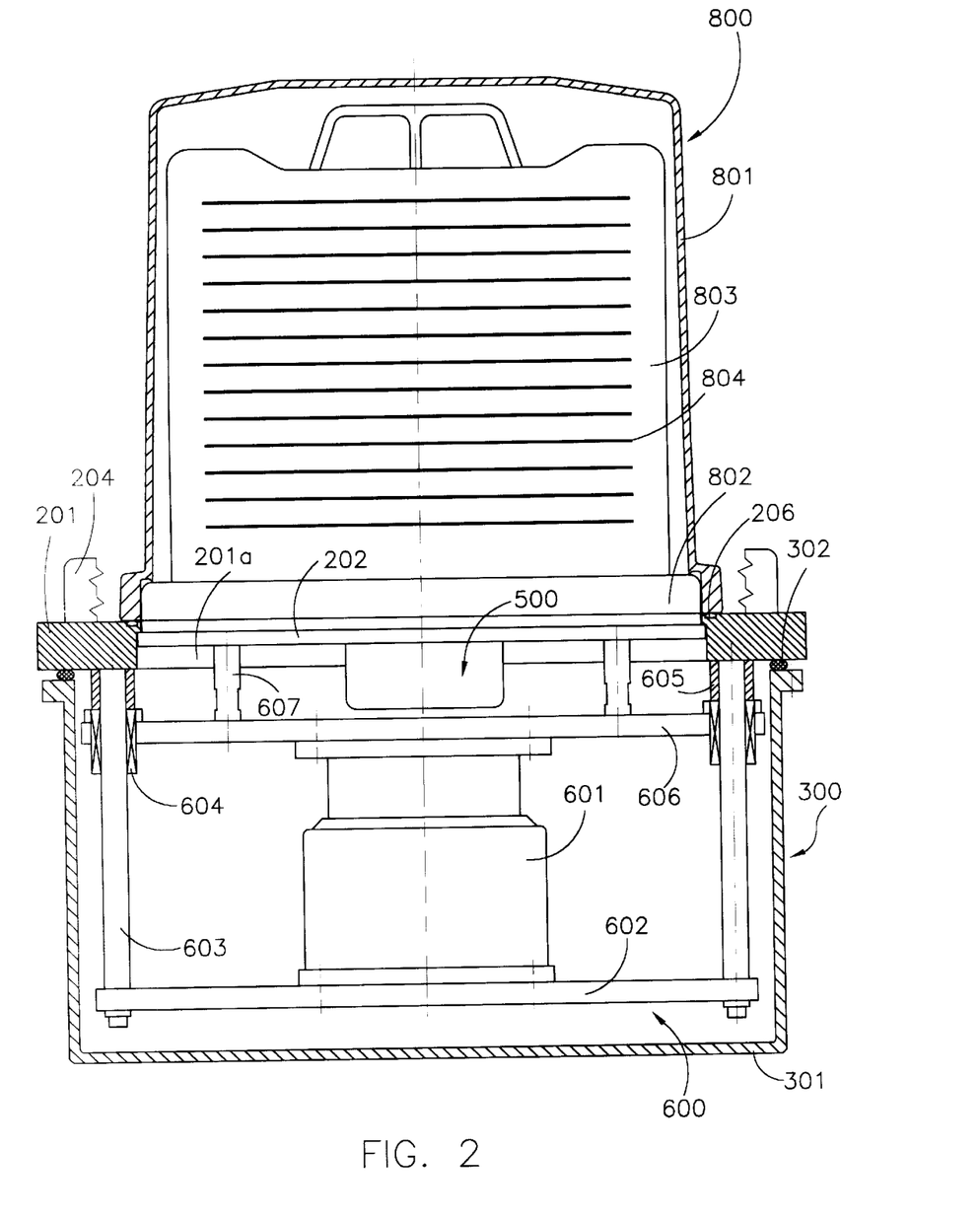
FIG. 2 is a front view of the gas filling system of the present invention in the sealed state, with the support frame and the gas supply unit left out.

Referring to FIGS. 2–4, the charging box 300 is located on the lower side of the port assembly 200, having a casing 301 for housing the port door up/down mechanism 600 with an open top side and an upper shoulder, on which a gasket 302 is laid. The gasket 302 seals the perimeter of the casing 301 against the platform 201 on the lower side thereof. Thus a sealed space is created which is enclosed by the pod cover 801 and the casing 301 and which is filled with gas. Two exhaust outlets 303, 304 are cut into the casing 301 of the charging box 300. Of these, the exhaust outlet 303 is located in a lateral wall of the casing 301, opposite to the nozzles 207a, 207b, and the exhaust outlet 304 is located in a bottom wall of the casing 301. Thus inert gas is left longer in the sealed space, and consumption thereof is reduced. Furthermore, a downward gas current through the exhaust outlet 304 takes along any slight quantity of dust created by operating the port door up/down mechanism 600 preventing dust settling on the wafers 804. A pressure switch 305 on the casing 301 controls pressure in the sealed space, preventing pressure therein from becoming too large.

As shown in FIGS. 1–7, two equal pod hold-down latch mechanisms 400a, 400b are mounted on the front and rear sides of the platform 201, inside the front and rear guide rails 204, 205, respectively. Each of the two pod hold-own latch mechanisms 400a, 400b comprises: a locking lever 401, a hinge 402, a transmission rod 403, a transmission head 404, a gas cylinder support 405, a gas pressure cylinder 406 for dust-free rooms with an upper end and a lower end, flow regulating valves 407, 408, an amplitude regulating block 409, a cushion plate 410, two adjusting screws 411, and two springs 412.

Figures 5, 6:
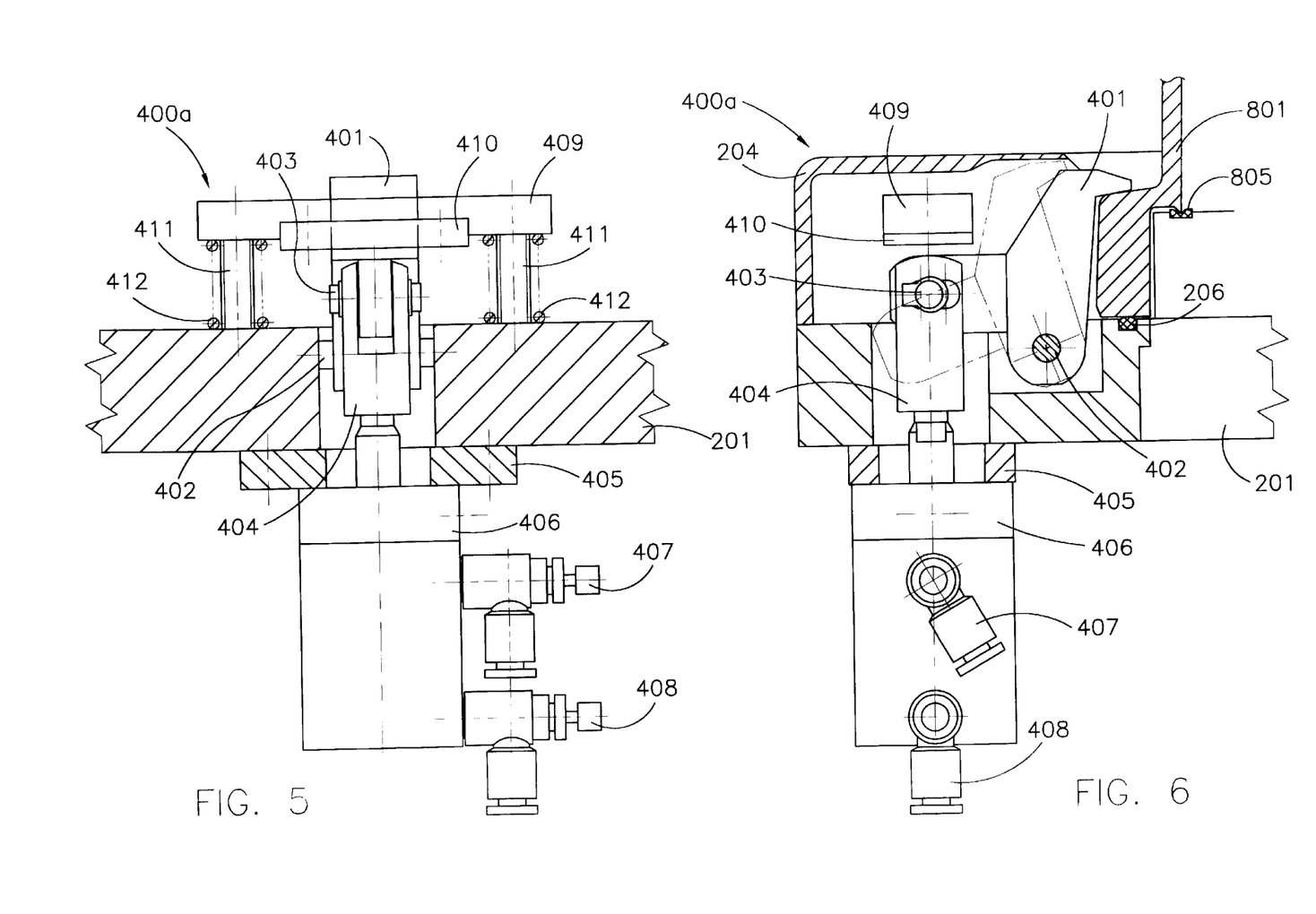
FIG. 5 is a front view of the front pod hold-down latch mechanism of the present invention.
FIG. 6 is a side view from the left of the front pod hold-down latch mechanism of the present invention.

The gas pressure cylinder 406 performs a linear movement with an amplitude, driving the transmission head 404. The transmission head 404 has a far end that via the transmission rod 403 is connected to the locking lever 401. The locking lever 401 is movable around the hinge 402. Thus the gas pressure cylinder 406 drives an unlocking/locking movement of the locking lever 401 around the hinge 402. As shown in FIGS. 5 and 6, the locking lever 401 has a gripper, which after the locking movement holds down the pod cover 801 on the peripheral shoulder thereof.

The two pod hold-down latch mechanisms 400a, 400b are used for holding the pod cover 801 when needed. When the gas pressure cylinder 406 goes upward, driving the locking movement of the locking lever 401, the gripper thereof holds down the pod cover 801, preventing the pod cover 801 from being separated from the platform 201. Furthermore, the pod cover 801 is prevented from vibrating when inert gas enters the sealed space rapidly through the nozzles 207a, 207b. When the gas pressure cylinder 406 moves downward, the gripper of the locking lever 401 retreats from the peripheral shoulder of the pod cover 801 into the guide rail 204, 205.

The gas pressure cylinder 406 has gas inlet openings on the upper and lower ends thereof. The flow regulating valves 407, 408 are respectively mounted at the gas inlet openings of the gas pressure cylinder 406 for controlling how fast the linear movement of the gas pressure cylinder 406 and, consequently, how fast the unlocking/locking movement of the gripper of the locking lever 401 are performed. For the linear movement of the gas pressure cylinder 406 to be stable, an additional flow regulating valve (not shown) is mounted on the gas inlet openings. By controlling the linear movement of the gas pressure cylinder 406 and the unlocking/locking movement of the gripper of the locking lever 401 no structural parts will be damaged due to fast uncontrolled movements.

Figure 7:
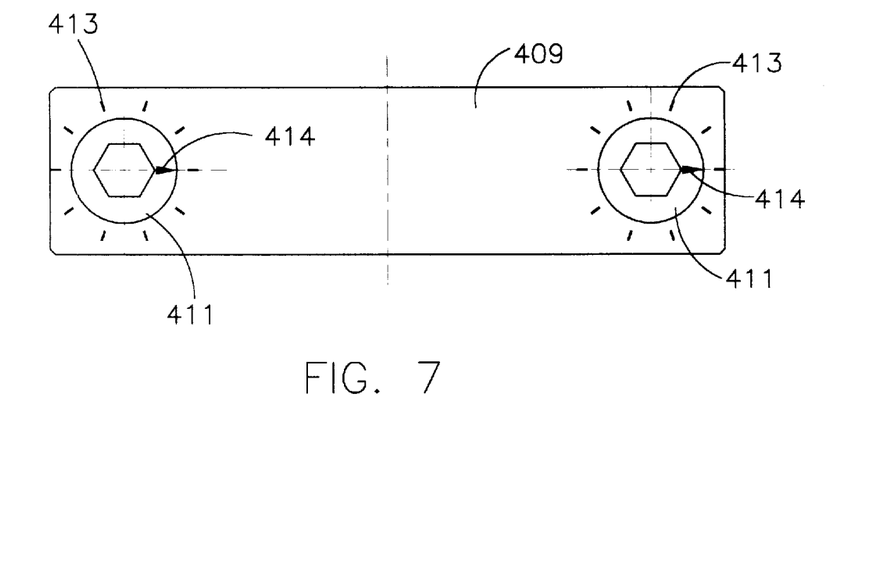
FIG. 7 is a top view of the amplitude regulating block of one of the pod hold-down latch mechanisms of the present invention.

Referring to FIGS. 5–7, the amplitude regulating block 409, the cushion plate 410, the adjusting screws 411 and the springs 412 serve to adjust the amplitude of the linear movement of the gas pressure cylinder 406 quickly, so as to determine the width of the unlocking/locking movement of the gripper of the locking lever 401. Thus the equal pod hold-down latch mechanisms 400a, 400b are suitable for a pod cover 801 of any type, reliably sealing the pod cover 801. The amplitude regulating block 409 is vertically passed through by the adjusting screws 411 and has an upper side where two sets of fixed marks 413 are engraved around the adjusting screws 411. The adjusting screws 411 carry triangular pointers 414. To adjust the amplitude, the adjusting screws 412 are turned in equal directions, as controlled by the pointers 414 moving against the fixed marks 413. For example, as shown in FIG. 7, with ten fixed marks 413 for a complete turn of the adjusting screws 411 and using M6×1.0 screws for the adjusting screws 411, proceeding a single mark corresponds to a change of amplitude of 0.1 mm.

Referring to FIGS. 2–4 and 9–10, the pod door lock/unlock mechanism 500 is located on the lower side of the port 202 in the center thereof and serves to lock and unlock a locking mechanism of the wafer pod base 802, so as to separate the pod cover 801 from the wafer pod base 802. The pod door lock/unlock mechanism 500 comprises: a casing 501, a motor seat 502, a motor 503, gears 504, 505, a worm gear with a worm 507 and a worm wheel 510, a shaft 506, first bearings 508, a bearing seat 509, a sensor plate 511, a turntable 512, bolts 513a, 513b, second bearings 514, an inner pressure plate 515, an outer pressure plate 516, sensors 517, 518 for the locked and unlocked states of the wafer pod base 802, and a position sensor 519 for positioning the wafer pod 800.

Figure 1:
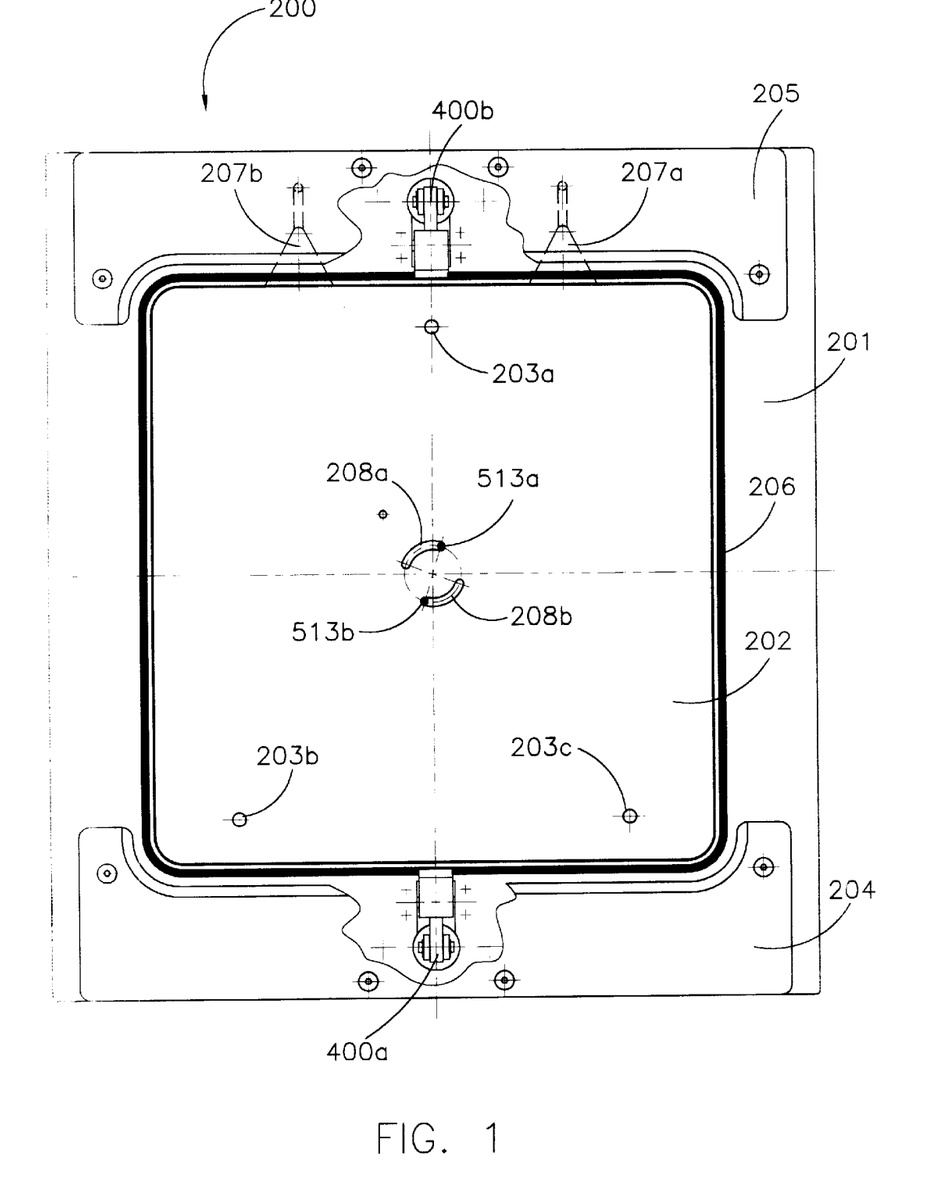
FIG. 1 is a top view of the port assembly of the present invention.

A rotational movement of the motor 503 is transmitted via the gears 504, 505 and the worm gear 507, 510 to the turntable 512 and the bolts 513a, 513b standing thereon. As shown in FIG. 1, the bolts 513a, 513b respectively pass through arc-shaped openings 208a, 208b, which are located in the center of the port 202. Turning the bolts 513a, 513b within the arc-shaped openings 208a, 208b locks and unlocks the locking mechanism of the wafer pod base 802, so as to separate the pod cover 801 from the wafer pod base 802. The locking mechanism of the wafer pod base 802 has to open and close with a certain amount of force. Too weak a force will not allow to open the locking mechanism, and too large a force risks damaging structural parts. The sensors 517, 518 sense the locked and unlocked states of the wafer pod base 802, respectively. This is done by the sensor plate 511 blocking light paths at the sensors 517, 518 sense in the locked and unlocked states, respectively. Thus it is made sure that the bolts 513a, 513b have locked or unlocked the locking mechanism of the wafer pod base 802. The position sensor 519 senses whether the wafer pod 800 lies flat on the port assembly.

Referring again to FIGS. 2–4, the port door up/down mechanism 600 comprises: a gas pressure cylinder 601 for dust-free rooms, a first support plate 602, guiding rods 603, linear bearings 604, a cushioning ring 605, a second support plate 606, first supporting rods 607, second supporting rods 608, and stoppers and screws (not shown). The second supporting rods 608 are mounted on the lower side of the platform 201, extending downward therefrom and having lower ends to which the first support plate 602 is attached. The first support plate 602 carries the gas pressure cylinder 601, the second support plate 606, the first supporting rods 607 and the port 202. The pressure gas cylinder 601 carries the second support plate 606, driving the second support plate 606 upward and downward, generating a vertical movement of the port door up/down mechanism 600. The guiding rods 603 are set on the second support plate 606, gliding within the linear bearings 604 and guiding the vertical movement of the port door up/down mechanism 600. The stoppers and screws fix a topmost position thereof. In addition, the cushioning ring 605 protects the port door up/down mechanism 600 from shocks.

The port door up/down mechanism 600 serves to lower the port 202 and the wafer pod base 802 with the cassette 803 simultaneously, after the pod door lock/unlock mechanism 500 has loosened the wafer pod base 802 from the pod cover 801, so that inert gas flows out through the nozzles 207a, 207b, and inert gas in the wafer pod 800 is exchanged. After filling with fresh gas, the port door up/down mechanism 600 raises the port 202 and the wafer pod base 802 with the cassette 803 again, until the wafer pod 800 is sealed again, now containing fresh inert gas.

Like the gas pressure cylinder 406 of the pod hold-down latch mechanisms 400a, 400b, the gas pressure cylinder 601 has an upper end and a lower end with gas inlets and regulating valves built therein, so as to smoothen the vertical movement of the gas pressure cylinder 601 and of the port 202 to generate no dust in the sealed space. For the linear movement of the gas pressure cylinder 601 to be stable, an additional flow regulating valve (not shown) is mounted on the gas inlet openings.

Another characteristic of the present invention are the two nozzles 207a, 207b, which are symmetrically mounted on the platform 201. As shown in FIGS. 1, 3, 4, 11 and 12, the nozzles 207a, 207b are located on the rear side of the platform in positions that are symmetrical to the left and right sides thereof. The nozzles 207a, 207b serve to fill the wafer pod 800 with inert gas. In order to make filling with inert gas more efficient and to reduce noise when inert gas flows out, the nozzles 207a, 207b gradually widen and are slightly tilted upward. The symmetric arrangement and widening of the nozzles 207a, 207b reduces the speed of gas flowing out and prevents damaging the wafers 804. By bending the nozzles 207a, 207b upwards, an outflowing gas jet will not hit the wafer pod base 802 and from there be deflected, generating an unfavorable flow of gas with little filling efficiency. Thus by bending the nozzles 207a, 207b upwards, faster filling of the wafer pod 800 is attained.

The sealed space enclosed by the pod cover 801, the platform 201 and the casing 301 and sealed by the gaskets 206, 302, has two zones, an upper zone, enclosed by the pod cover 801 and the platform 201 and sealed by the gasket 206, and a lower zone, enclosed by the casing 301 and the platform 201 and sealed by the gasket 301. In the topmost position of the port door up/down mechanism 600, in a sealed state, the upper and lower zones are sealed against each other. When entering the upper zone through the nozzles 207a, 207b, inert gas has to pass through the four gaps 209 between the platform 201 and the port 202 to reach the lower zone. While the four gaps 209 are equally narrow, considerable resistance slows down the flow of inert gas into the lower zone. If the gap 209 that is located opposite to the nozzles 207a, 207b is relatively wide, with the other three gaps 209 still narrow, the flow of inert gas will mainly take the longest path with minimum resistance, and filling of the lower zone is more efficient.

Figure 8:
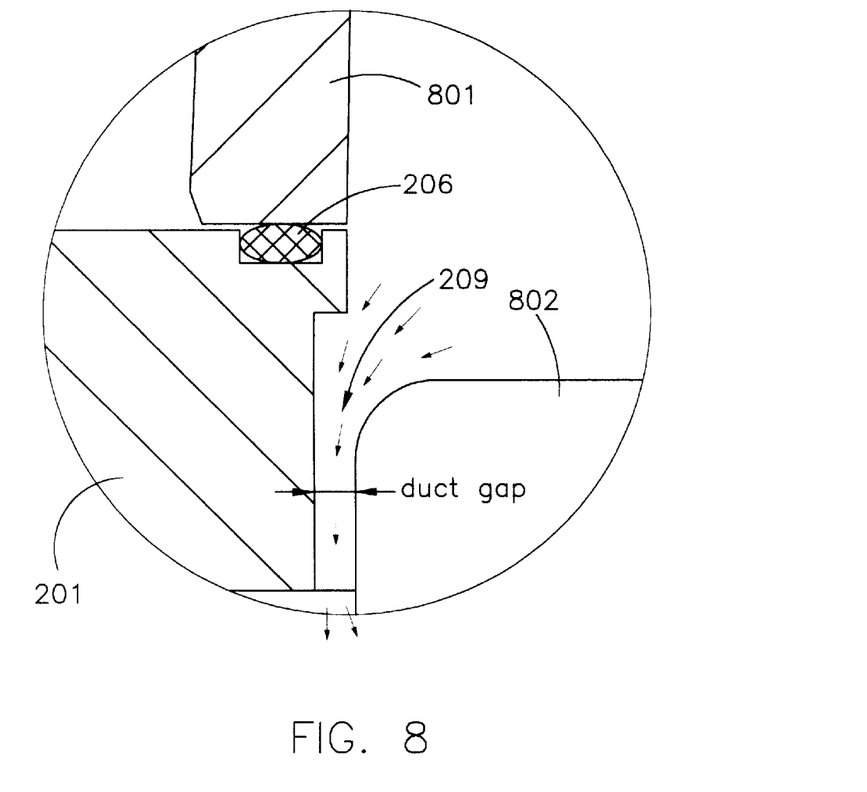
FIG. 8 is an enlarged view of the area 8—8 of FIG. 4 to show the duct gap of the gas filling system.
Figure 9:
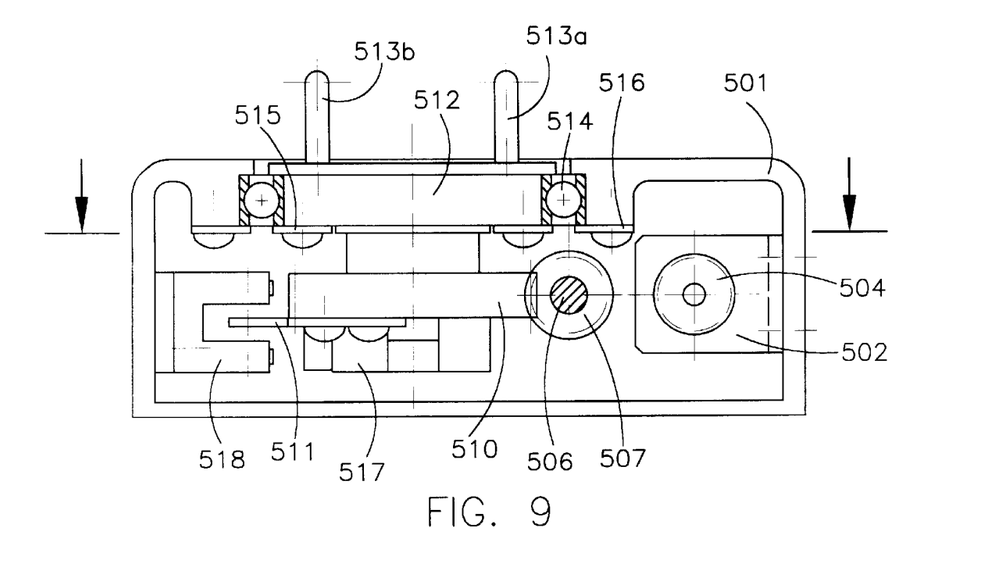
FIG. 9 is a front view of the pod door lock/unlock mechanism of the present invention.
Figure 10:
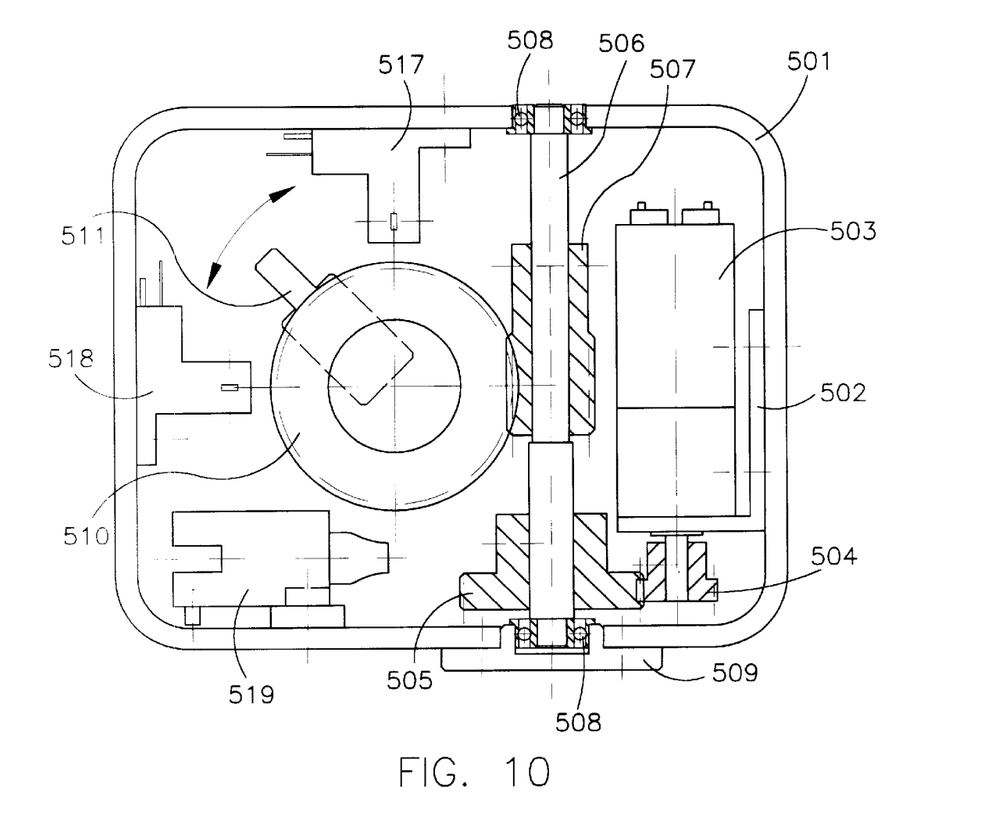
FIG. 10 is a sectional view of the pod door lock/unlock mechanism of the present invention.
Figure 11:
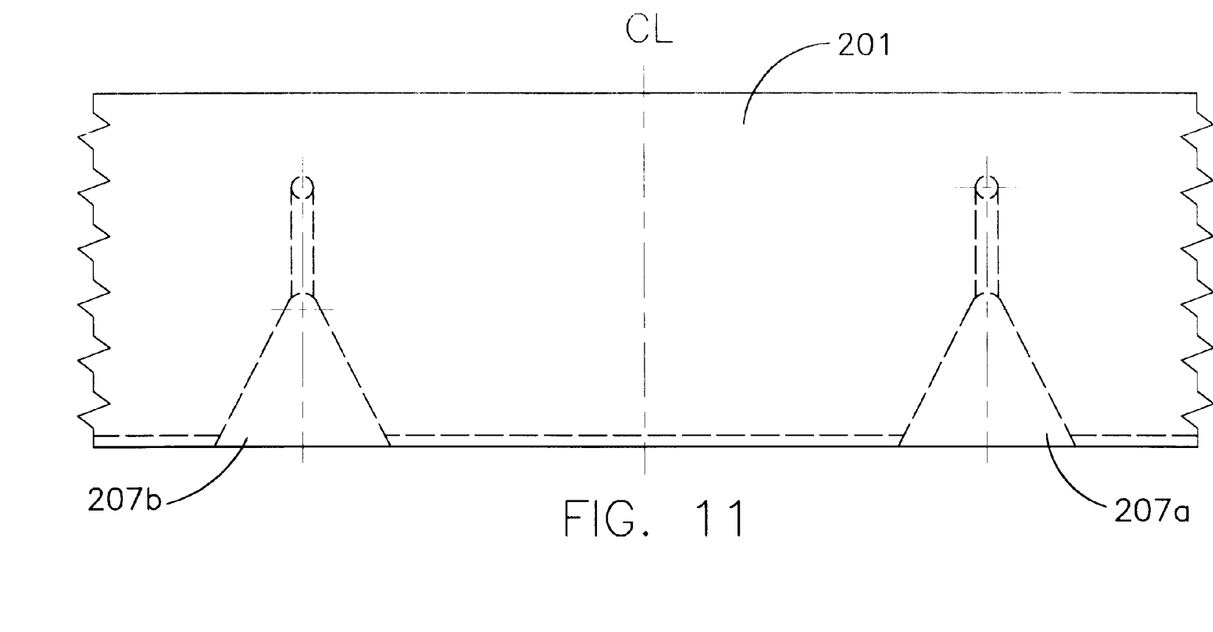
FIG. 11 is a top view of the gas filling nozzles of the present invention.
Figure 12:
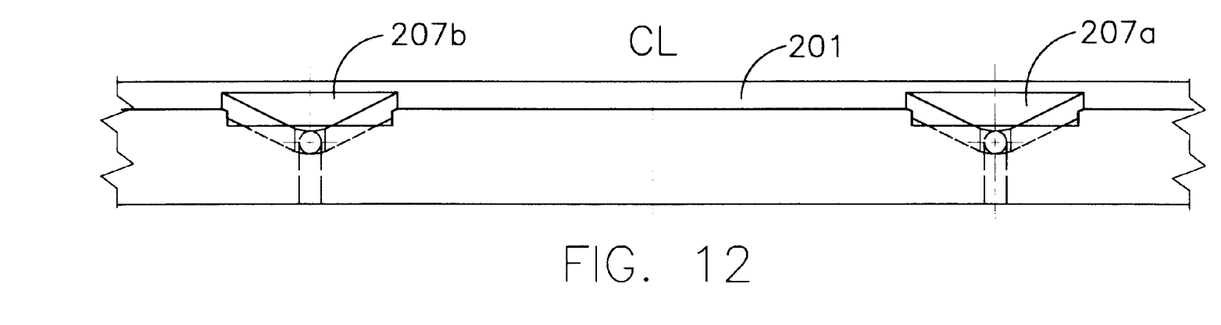
FIG. 12 is a front view of the gas filling nozzles of the present invention, as seen from the outlets of the nozzles.

Therefore, as shown in FIGS. 4 and 8, the present invention has a gap 209 opposite to the nozzles 207a, 207b that is relatively wide and takes in most of the flow of inert gas into the lower zone, reducing resistance on the longest path into the lower zone.

In order to be able to regulate pressure and flow rate of inert gas supplied, the present invention employs the gas supply unit 700. As shown in FIGS. 3 and 4, the gas supply unit 700 comprises: a membrane valve 701, a manometer 702, a gas-controlled valve 703, a regulating valve 704, a flow sensor 705, a display 706, a rough filter 707, a fine filter 708, an exhaust valve 709, a back-flow blocking valve 710, and a vacuum pump 711.

The exhaust valve 709 is connected to the exhaust outlets 303, 304, leading from there to the vacuum pump 711 to empty the lower zone of the sealed space inside the casing 301 from gas. Fresh inert gas with high pressure passes through the membrane valve 701, where pressure is regulated, then through the gas-controlled valve 703, the flow sensor 705, the rough filter 707, the fine filter 708, and finally through the nozzles 207a, 207b.

After fresh inert gas has entered the sealed space, pressure is lowered to a suitable value by using the membrane valve 701 and displayed by the manometer 702 to an operator, and the filling of the inert gas is controlled by the gas-controlled valve 703 with a speed that is controlled by the regulating valve 704. During filling of the inert gas, a flow rate of the inert gas is measured by the flow sensor 705 and shown on the display 706. The flow rate is regulated manually by using the gas-controlled valve 703. The rough and fine filters 707, 708 filter out any dust and particles according to U.S. Federal Standard 209E, Class 1. Finally the inert gas enters the sealed space enclosed by the pod cover 801 and the casing 301. After opening the exhaust valve 709, the vacuum pump 711 sucks inert gas through the exhaust valve 709 and the back-flow blocking valve 710 into an exhaust pipe. Repeated filling and sucking operations by the gas supply unit 700 gradually remove a previous filling of air from the sealed space and substitute inert gas up to a desired degree. The back-flow blocking valve 710 prevents gas from flowing into the sealed space from the vacuum pump 711 and the exhaust pipe.

Figure 13:
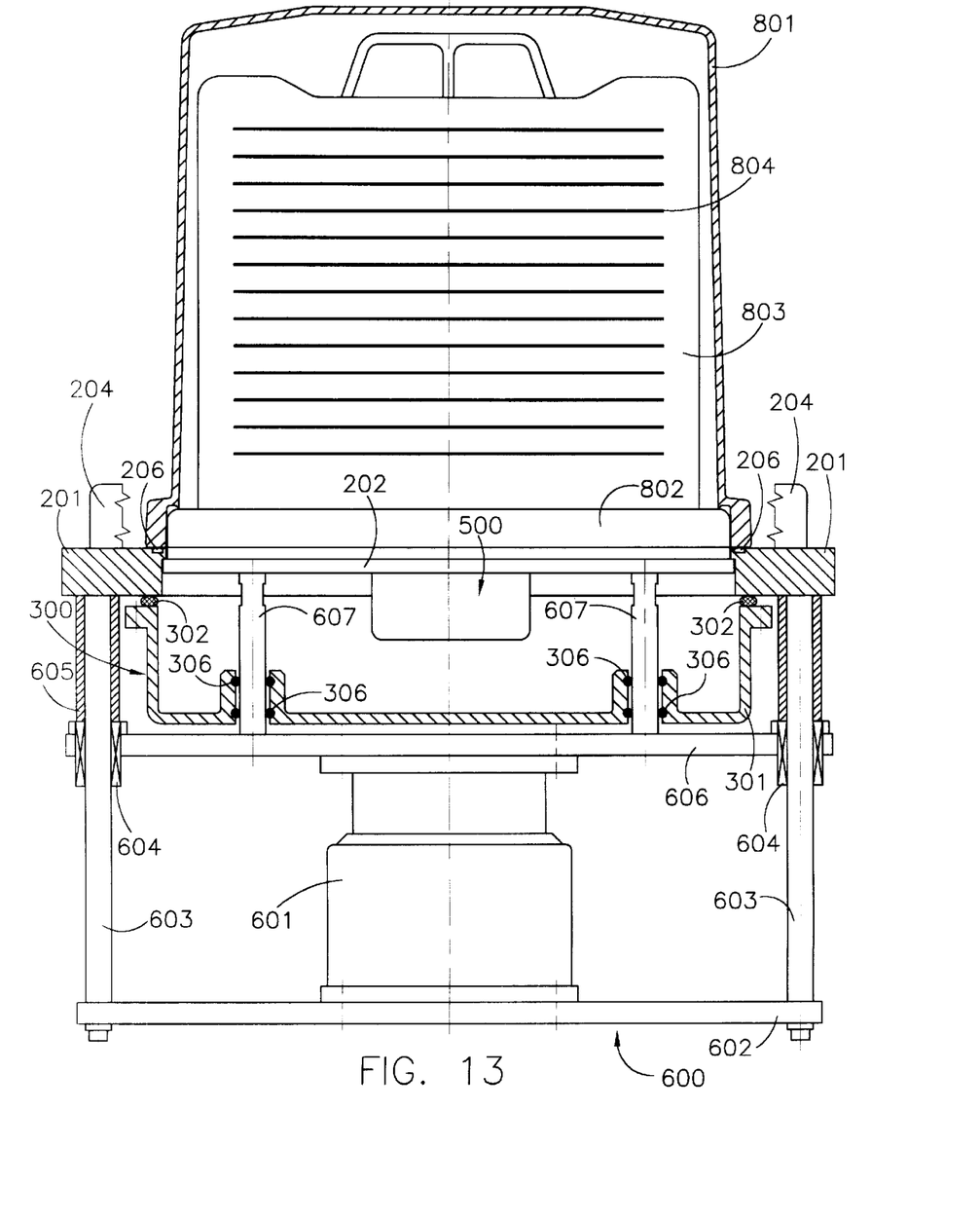
FIG. 13 is a front view of the gas filling system of the present invention in the second embodiment, with the support frame and the gas supply unit left out.
Figure 14:
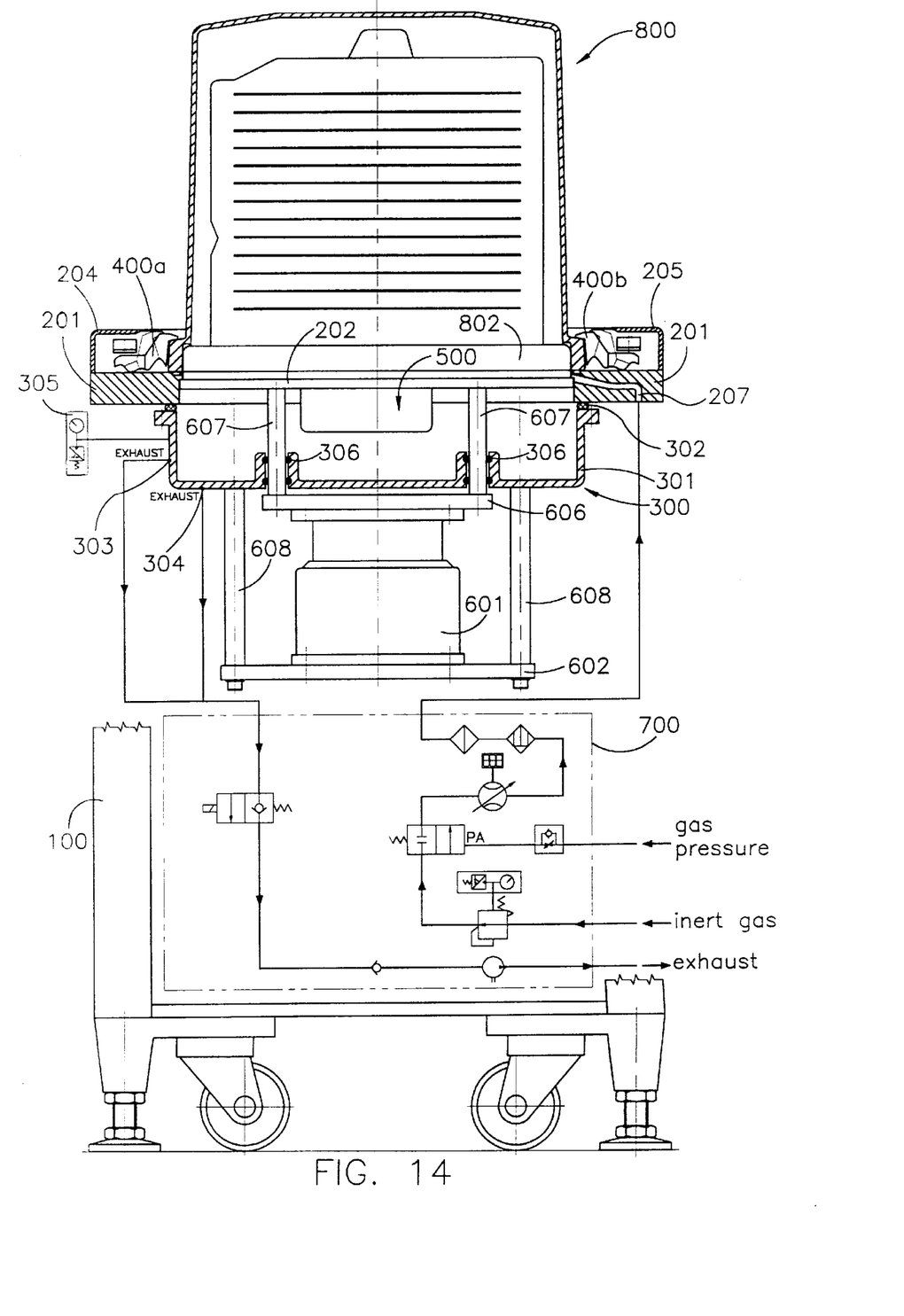
FIG. 14 is a side view from the left of the gas filling system of the present invention in the second embodiment.
Figure 15:
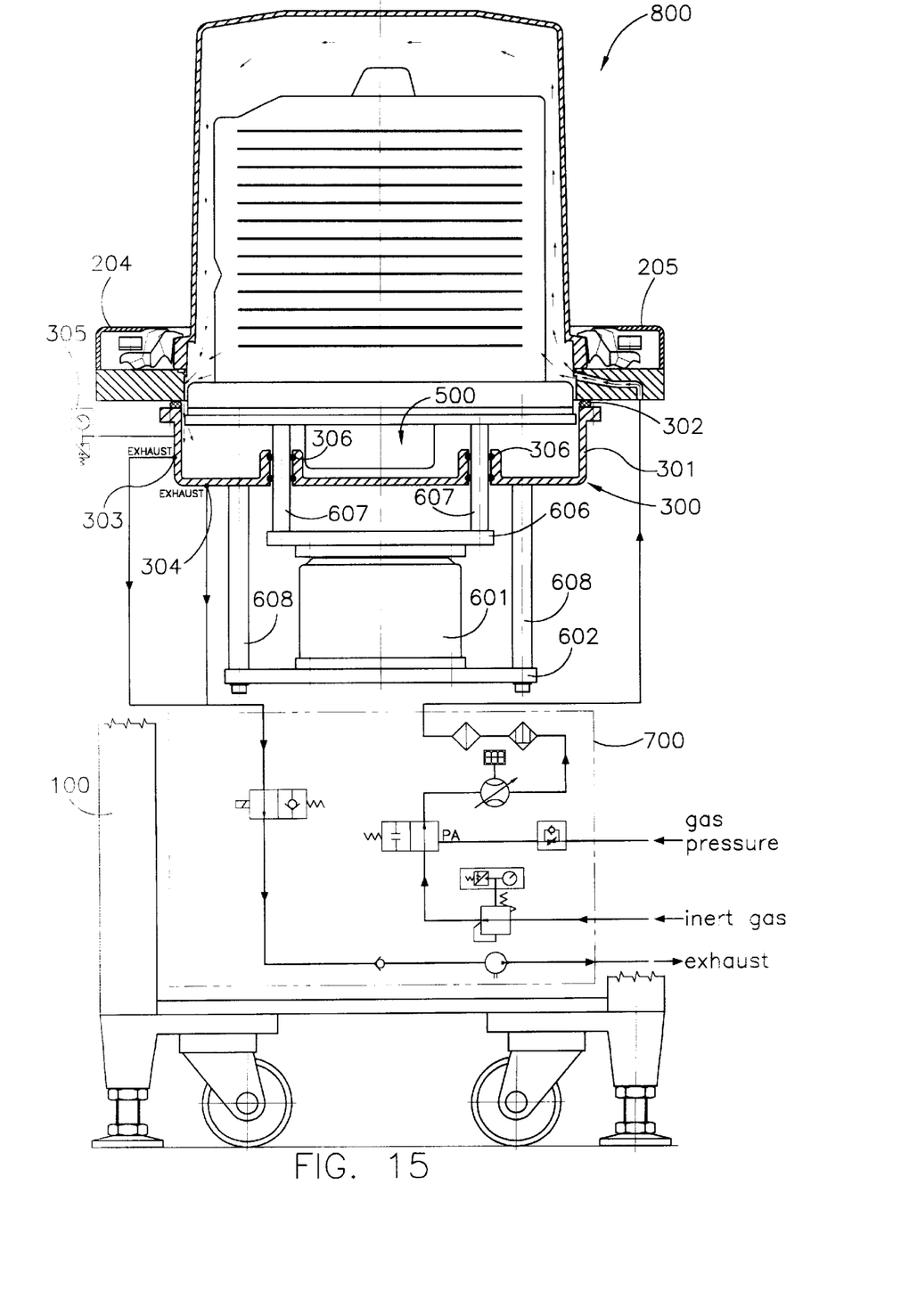
FIG. 15 is a side view from the left of the gas filling system of the present invention in the second embodiment in the filling state.

Referring to FIGS. 13–15, in a second embodiment of the present invention the port door up/down mechanism 600 is located outside the charging box 300, facilitating the vertical movement of the port door up/down mechanism 600 and leaving the charging box with a small volume. Thus consumption of inert gas is further reduced, and a source of dust and particles in the sealed space is eliminated.

While the invention has been described with reference to preferred embodiments thereof, it is to be understood that modifications or variations may be easily made without departing from the spirit of this invention which is defined by the appended claims.

What is claimed is:

1. A standard mechanical interface wafer pod gas filling system, comprising:

a main frame;

a port assembly, mounted on said main frame, carrying a wafer pod which has a pod cover and a wafer pod base with wafers and further comprising;

a platform, having an upper side, to which guide rails are attached for positioning said wafer pod, a lower side, a central opening, accommodating said wafer pod base with said wafers, and lateral sides, with several nozzles mounted on one of said lateral sides, said nozzles having widening ends and being tilted upward, a port, centrally located in said opening and carrying said wafer pod base with said wafer, being movable inside said opening in a vertical movement with a topmost position, with lateral gaps opening between said platform and said port below said topmost position of said port, one of said lateral gaps being located opposite to said nozzles and being wider than any other of said lateral gaps, so as to take in a large quantity of gas flowing out of said nozzles;

a pod hold-down latch mechanism, mounted on said platform inside said guide rails, holding said pod cover;

a port door up/down mechanism, driving said port to perform said vertical movement;

a charging box, mounted on said lower side of said platform, enclosing said port door up/down mechanism, accommodating said vertical movement of said port, tightly connected to said platform, forming a sealed space, and having at least one exhaust outlet located opposite to said nozzles;

a pod door lock/unlock mechanism, for opening a locking mechanism between said wafer pod base and said pod cover, so as to separate said wafer pod base and said pod cover; and a gas supply unit, having a supply pipe connected to said nozzles and an exhaust pipe connected to said at least one exhaust outlet, allowing inert gas to flow into said wafer pod and into said charging box and to take air out of said wafer pod and said charging box.

2. A standard mechanical interface wafer pod gas filling system according to claim 1, wherein said pod hold-down latch mechanism further comprises:

a locking lever, hingedly mounted on said platform, fixing said pod cover on said platform;

a gas pressure cylinder, driving an unlocking/locking movement of said locking lever with a driving speed and an amplitude for releasing or holding said pod cover;

a flow regulating valve, controlling said driving speed of said gas pressure valve;

an amplitude regulating block, controlling said amplitude of said gas pressure valve.

3. A standard mechanical interface wafer pod gas filling system according to claim 1, wherein said pod door lock/unlock mechanism further comprises:

a turntable, carrying bolts that engage with said locking mechanism;

a motor;

a gear system, transmitting a rotating movement of said motor to a turning movement of said turntable.

4. A standard mechanical interface wafer pod gas filling system according to claim 1, wherein said port door up/down mechanism further comprises:

a gas pressure cylinder, driving said vertical movement of said port with a driving speed;

a flow regulating valve, controlling said driving speed of said gas pressure valve, so as to prevent flying dust from being generated.

5. A standard mechanical interface wafer pod gas filling system according to claim 1, wherein said gas supply unit has a membrane valve to control and fix a pressure value of supplied inert gas.

6. A standard mechanical interface wafer pod gas filling system according to claim 1, wherein said gas supply unit has a gas-controlled valve to control flow of supplied inert gas and a regulating valve, controlling said gas-controlled valve to have supplied inert gas flow with a regulated speed.

7. A standard mechanical interface wafer pod gas filling system according to claim 1, wherein said gas supply unit has a back-flow blocking valve to prevent a back-flow of exhaust gas with subsequent polluting said wafers.

* * * * *